US008552772B2

(12) United States Patent  
Jovenin

(10) Patent No.: US 8,552,772 B2  
(45) Date of Patent: Oct. 8, 2013

(54) LOOP FILTER BUFFER WITH LEVEL SHIFTER

(75) Inventor: Fabrice Jovenin, Colombelles (FR)

(73) Assignee: Asahi Kasei Microdevices Corporation, Tokyo (JP)

( * ) Notice: Subject to any disclaimer, the term of this patent is extended or adjusted under 35 U.S.C. 154(b) by 126 days.

(21) Appl. No.: 12/985,566

(22) Filed: Jan. 6, 2011

(65) Prior Publication Data

US 2012/0176171 A1 Jul. 12, 2012

(51) Int. Cl.
*H03L 7/06* (2006.01)

(52) U.S. Cl.
USPC ........... 327/156; 327/155; 327/157; 327/146; 327/147

(58) Field of Classification Search
USPC ......... 327/141, 144–163, 108–112, 379, 389, 327/391, 333; 331/15–17; 375/373–376; 326/62, 63, 68, 80, 22–27, 81–87
See application file for complete search history.

(56) References Cited

U.S. PATENT DOCUMENTS

| | | | |
|---|---|---|---|
| 5,783,971 A | 7/1998 | Dekker | |
| 6,002,273 A | 12/1999 | Humphreys | |
| 6,222,385 B1 * | 4/2001 | Kang | 326/68 |
| 6,927,716 B2 | 8/2005 | Keaveney et al. | |
| 7,012,471 B2 | 3/2006 | Lyden et al. | |
| 7,606,342 B1 * | 10/2009 | Wiss et al. | 375/371 |
| 2008/0297263 A1 * | 12/2008 | Park | 331/1 A |

FOREIGN PATENT DOCUMENTS

| | | |
|---|---|---|
| JP | 9-294070 A | 11/1997 |
| JP | 2009-16996 A | 1/2009 |

OTHER PUBLICATIONS

International Search Report and Written Opinion issued in corresponding International application No. PCT/JP2011/007234, mailed Mar. 27, 2012.

* cited by examiner

*Primary Examiner* — Lincoln Donovan
*Assistant Examiner* — Brandon S Cole
(74) *Attorney, Agent, or Firm* — Morgan, Lewis & Bockius LLP

(57) ABSTRACT

A system in accordance with the present invention may include a phase-locked loop circuit, comprising a first input signal oscillating at a reference frequency, a second input signal received from a voltage-controlled oscillator (VCO) after passing through an N-divider, a phase detector and charge-pump, the phase detector comparing a phase of the first input signal and a phase of the second input signal, a loop filter in series with the phase detector and charge-pump, the loop filter having an integrator, a pole zero, and a post-filter, and a buffer in parallel with the integrator and in series with the post-filter, the buffer receiving an output signal from the integrator and isolating the integrator from an input impedance of the post-filter, and the buffer having a multiplexer for selecting between a plus and minus level shift signal, wherein the VCO is in series with the loop filter and the N-divider, and the VCO is configured to receive a tuning voltage signal from the loop filter.

28 Claims, 7 Drawing Sheets

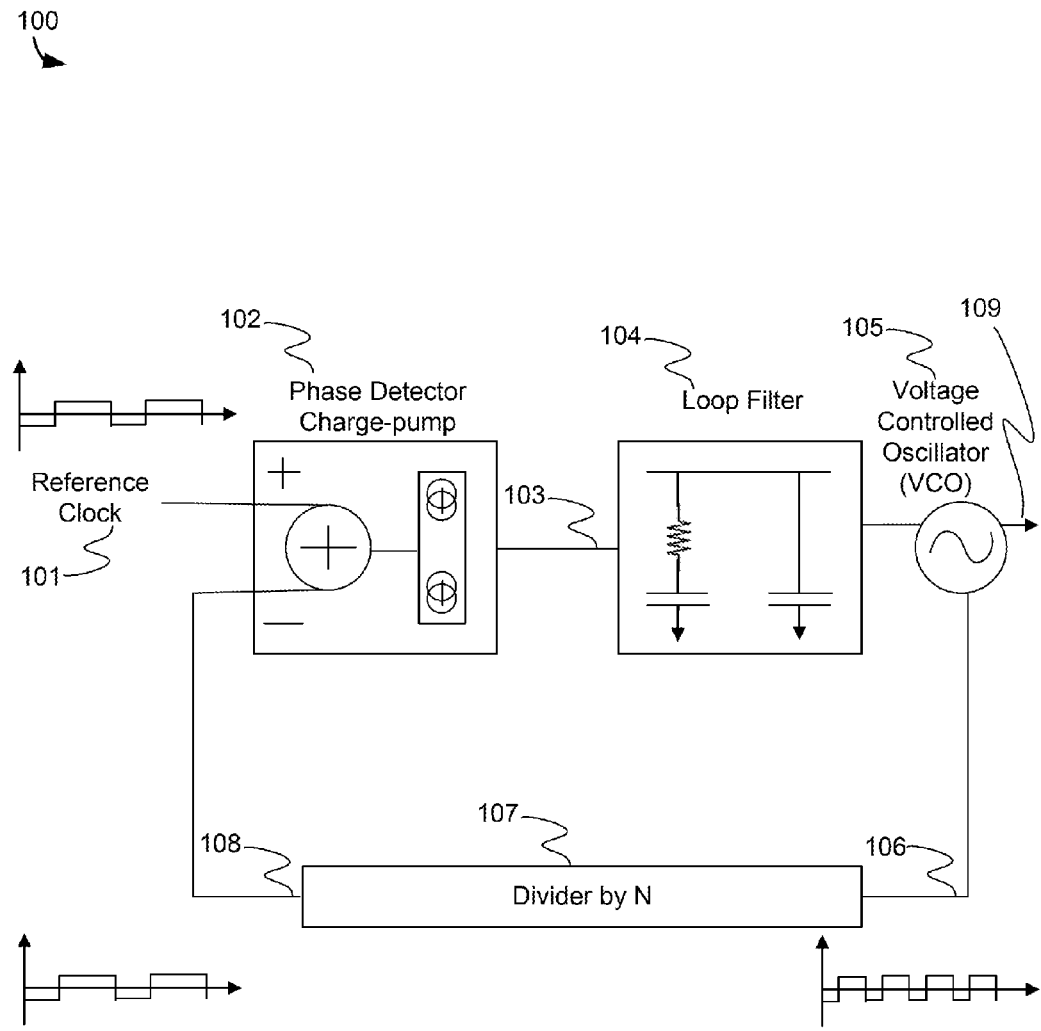
Conventional
Figure 1

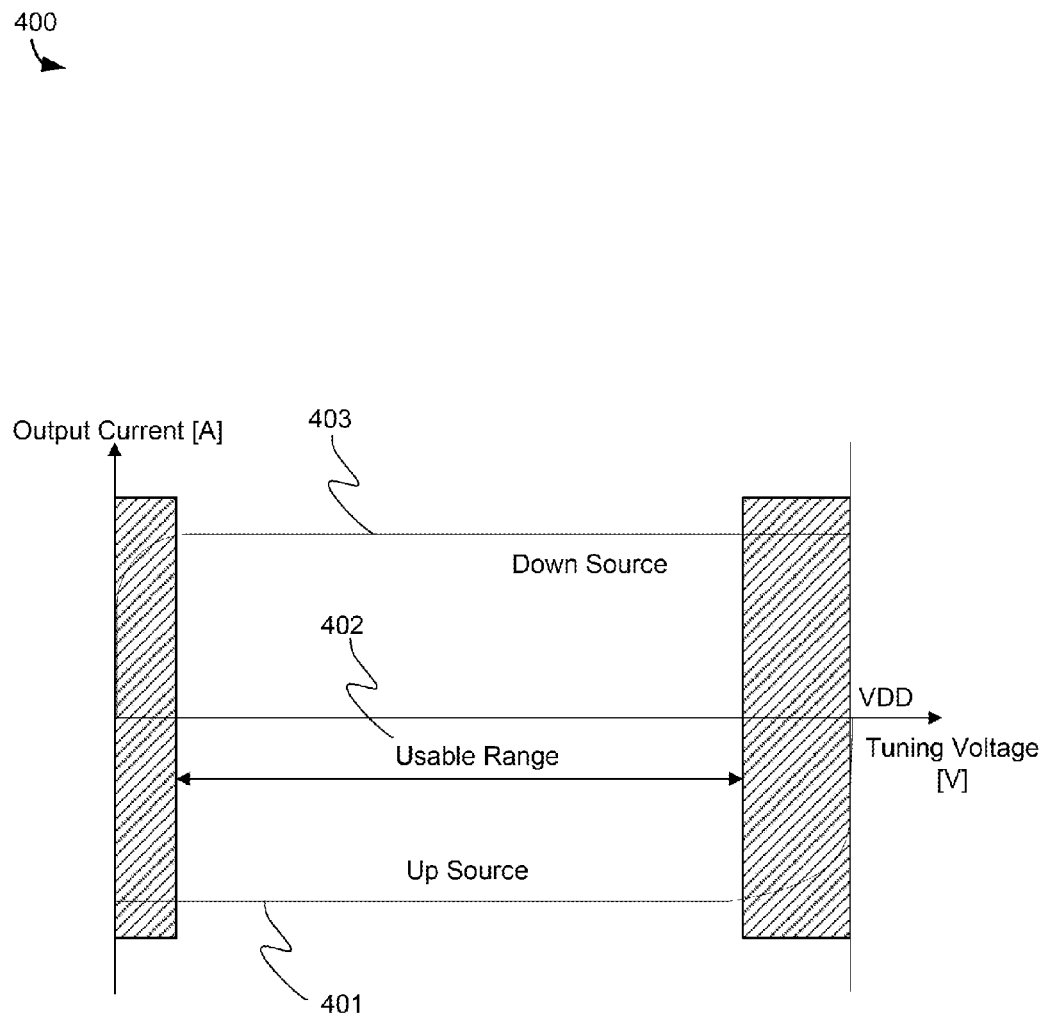
Conventional
Figure 4

LOOP FILTER BUFFER WITH LEVEL SHIFTER

FIELD OF INVENTION

The present invention relates generally to the field of phase-locked loops and, in particular, to the field of a phase-locked loop filter buffer.

BACKGROUND OF INVENTION

Current phase-locked loop (PLL) circuits may include features for comparing the phase of an output signal from a voltage-controlled oscillator (VCO) with the phase of an input reference frequency to the PLL. Such circuits may include a phase frequency detector for producing an error signal that signifies the proportion of any phase difference between the output signal and the input reference frequency. In addition, current PLL circuits may also include features for feeding the error signal into a low-pass filter and then into the VCO such that the output signal that is produced is synchronized with the input reference frequency to the PLL. Current PLL circuits may employ the negative feedback loop method of feeding the output from the VCO back into the input of the phase frequency detector such that an error signal may be generated, coupling the output signal from the VCO to the input reference frequency. In some current PLL circuits, the output signal may be fed into a frequency divider circuit to produce an integer multiple of the input reference frequency.

However, current PLL circuits do not include a loop filter in series with a phase detector and charge-pump, where the loop filter receives a signal from the phase detector and charge-pump, filters the signal, and feeds the output signal from the loop filter into a VCO. In particular, current PLL circuits do not include a loop filter that includes a standard integrator, pole zero, and RLC post-filter. A buffer may be inserted at the output of the integrator to isolate the integrator from the impedance of the RLC post-filter. In addition, the buffer may extend the tuning voltage range, which is limited by the linear response of the charge pump, and apply it to the VCO by selecting between an N-type and P-type source follower, where the P-type source follower may level shift the charge pump output up by approximately +0.5 volts (V) and the N-type source follower may level shift the charge pump output down by approximately −0.5 volts (V).

SUMMARY OF THE INVENTION

Accordingly, the present invention is directed to a system and method for implementing a loop filter buffer with level shifter in a phase-locked loop circuit that substantially obviates one or more problems due to limitations and disadvantages of the related art.

In an embodiment, the present invention provides a phase-locked loop circuit, comprising a voltage-controlled oscillator (VCO) for providing a VCO output signal, an N-divider having an input for receiving the VCO output signal and for providing an N-divided output signal, a first input signal oscillating at a reference frequency, a second input signal received from a voltage-controlled oscillator (VCO) after passing through an N-divider, a phase detector and charge-pump, the phase detector comparing a phase of the first input signal and a phase of the second input signal, a loop filter in series with the phase detector and charge-pump, the loop filter having an integrator, a pole zero, and a post-filter (i.e., resistor-inductor-capacitor (RLC), resistor-capacitor (RC), or inductor-capacitor (LC)), and a buffer in parallel with the integrator and in series with the post-filter, the buffer receiving an output signal from the integrator and isolating the integrator from an input impedance of the post-filter, and the buffer having a multiplexer for selecting between a plus and minus level shift signal, wherein the VCO is in series with the loop filter and the N-divider, and the VCO is configured to receive a tuning voltage signal from the loop filter.

In yet another embodiment, the loop filter receives a signal from the phase detector and charge-pump at the integrator.

In yet another embodiment, the buffer has an input impedance approximately equal to an output impedance of the integrator and an output impedance approximately equal to the input impedance of the post-filter.

In yet another embodiment, the N-divider receives an output oscillating signal from the VCO.

In yet another embodiment, the N-divider outputs an N-divided frequency signal into the inverse voltage input of the phase detector and charge-pump.

In yet another embodiment, a P-type source follower provides the plus level shift signal to level shift up the output from the charge-pump by a first voltage.

In yet another embodiment, an N-type source follower provides the minus level shift signal to level shift down the output from the charge-pump by a second voltage.

In yet another embodiment, the plus level shift signal has a voltage equal to approximately +0.5 volts (V).

In yet another embodiment, the minus level shift signal has a voltage equal to approximately −0.5 volts (V).

In a further embodiment, the present invention provides a method implemented using a phase-locked loop circuit, the method comprising the steps of receiving a first input signal oscillating at a reference frequency, receiving a second input signal received from a voltage-controlled oscillator (VCO) after passing through an N-divider, comparing at a phase detector and charge-pump a phase of the first input signal and a phase of the second input signal, configuring a loop filter in series with the phase detector and charge-pump, the loop filter having an integrator, a pole zero, and a post-filter, configuring a buffer in parallel with the integrator and in series with the post-filter, the buffer receiving an output signal from the integrator and isolating the integrator from an input impedance of the post-filter, the buffer having a multiplexer for selecting between a plus and minus level shift signal, and configuring the VCO in series with the loop filter and the N-divider, and receiving at the VCO a tuning voltage signal from the loop filter.

In yet another embodiment, the plus level shift signal is generated by a P-type source follower.

In yet another embodiment, the minus level shift signal is generated by an N-type source follower.

In yet another embodiment, the loop filter receives a signal from the phase detector and charge-pump at the integrator.

In yet another embodiment, the buffer has an input impedance approximately equal to an output impedance of the integrator and an output impedance approximately equal to the input impedance of the post-filter.

In yet another embodiment, the method includes a step for receiving at the N-divider an output oscillating signal from the VCO.

In yet another embodiment, the method includes a step for outputting by the N-divider an N-divided frequency signal into the inverse voltage input of the phase detector and charge-pump.

In yet another embodiment, the method includes a step for providing by a P-type source follower the plus level shift signal to level shift up the output from the charge-pump by a first voltage.

In yet another embodiment, the method includes a step for providing by an N-type source follower the minus level shift signal to level shift down the output from the charge-pump by a second voltage.

In yet another embodiment, the plus level shift signal has a voltage equal to approximately +0.5 volts (V).

In yet another embodiment, the minus level shift signal has a voltage equal to approximately −0.5 volts (V).

In yet a further embodiment, the present invention comprises a loop filter buffer, comprising an input for receiving an input signal, an output for outputting an output signal, an N-type source follower connected to the input, a P-type source follower connected to the input, and a multiplexer connected to the N-type source follower, the P-type source follower, and the output, the multiplexer selecting between the N-type and the P-type source follower, wherein the multiplexer is configured to select the N-type source follower when the output signal has a tuning voltage close to zero (0) volts, wherein the multiplexer is configured to select the P-type source follower when the output signal has a tuning voltage close to a supply voltage (VDD).

In yet another embodiment, the output is connected to an input of a post-filter circuit.

In yet another embodiment, the input is connected to an output of an integrator.

In a further embodiment, the present invention provides a method implemented using a loop filter buffer, the method comprising the steps of receiving an input for an input signal, outputting an output for an output signal, connecting an N-type source follower to the input, connecting a P-type source follower to the input, and selecting between the N-type and the P-type source follower using a multiplexer connected to the N-type source follower, the P-type source follower, and the output, configuring the multiplexer to select the N-type source follower when the output signal has a tuning voltage close to zero (0) volts, and configuring the multiplexer to select the P-type source follower when the output signal has a tuning voltage close to a supply voltage (VDD).

In yet a further embodiment, the method includes a step for connecting the output to an input of a post-filter circuit.

In yet a further embodiment, the method includes a step for connecting the input to an output of an integrator.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings:

FIG. 1 illustrates an exemplary embodiment of a phase-locked loop (PLL) circuit with a loop filter in series with a phase detector and charge-pump in accordance with the conventional invention;

FIG. 4 illustrates an exemplary illustration of the DC response characteristics of each charge-pump current source type versus the DC voltage present at the charge pump output in accordance with the conventional invention;

DETAILED DESCRIPTION

Figure 2:
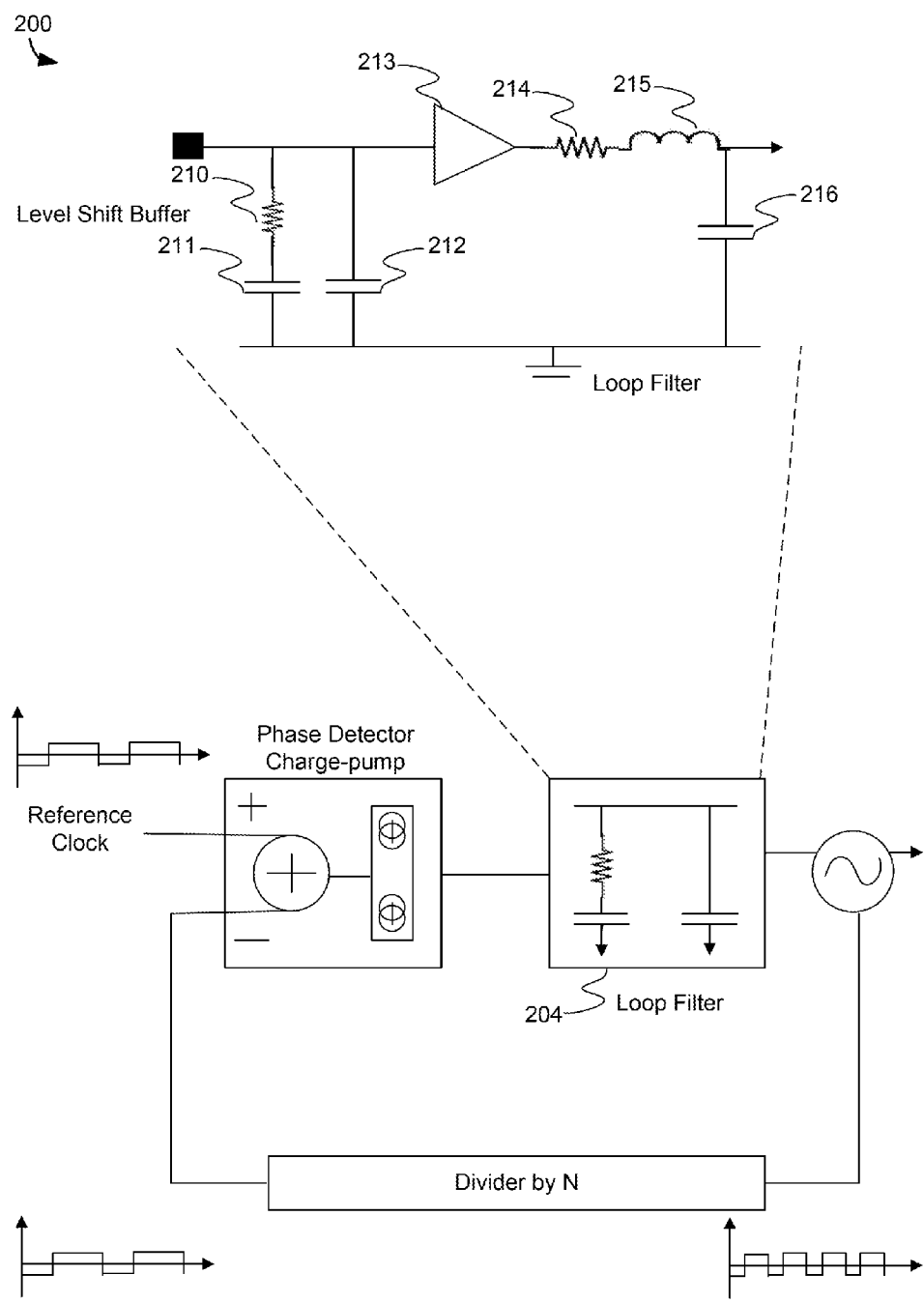
FIG. 2 illustrates an exemplary embodiment of a loop filter circuit in accordance with the present invention.

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details. For example, it will be apparent to one of ordinary skill in the art that the subject matter presented herein can be implemented on any type of phase-locked loop circuit (PLL).

FIG. 1 illustrates an exemplary embodiment 100 of a phase-locked loop (PLL) circuit with a loop filter 104 in series with a phase detector and charge-pump 102 in accordance with the conventional invention. In the exemplary embodiment 100, a reference clock signal 101 may be an input to the phase detector and charge-pump 102 along with the output signal 108 from an N-divider 107. The phase detector and charge-pump 102 may detect the phase difference between the reference clock signal 101 and the output signal 108. The output signal 103 from the phase detector and charge-pump 102 may be equal to the tuning voltage range required to cover a given frequency band on a voltage controlled oscillator (VCO) 105, which may equal the DC output operational range of the charge-pump 102. The output signal 103 from the phase detector and charge-pump 102 may be received at the loop filter 104. The loop filter 104 is generally a passive circuit. The loop filter 104 may adjust the output signal 103 to conform more closely to the tuning voltage input to the VCO 105. In doing so, the loop filter 104 may include a standard integrator and pole zero and a resistor-inductor-capacitor (RLC) post filter. The loop filter 104 may extend the actual usable range of the charge-pump 102 by filtering the charge-pump 102 current pulses. A first output signal 109 from the VCO 105 may be used as the input, for example, to a device connected to the VCO 105 for receiving a specific signal oscillating at a frequency controlled by the tuning voltage input to the VCO 105. A second output signal 106 from the VCO 105 may be used to create a negative feedback loop circuit through the N-divider 107 for use as an input to the phase detector and charge-pump 102. The N-divider 107 may divide the second output signal 106 by N times, where N is a division ratio corresponding to N times the frequency of the reference clock signal 101.

FIG. 2 illustrates an exemplary embodiment 200 of a loop filter 204 circuit in accordance with the present invention. In exemplary embodiment 200, the individual elements of the loop filter 204 circuit are shown. In particular, the loop filter 204 circuit includes a standard integrator and pole zero 210-212, a buffer 213, and a resistor-inductor-capacitor (RLC) post filter 214-216. The buffer 213 may be used to isolate the output impedance of the standard integrator and pole zero 210-212 from the input impedance of the RLC post filter 214-216. By placing the buffer 213 in between, the buffer 213 extends the actual usable range of the charge pump 102 because the output signal 103 from the charge pump 102 may not be affected by the input impedance of the RLC post filter 214-216. In some embodiments, the input impedance of the RLC post filter 214-216 may be higher than the output impedance of the charge pump 102. In some embodiments, the input impedance of the RLC post filter 214-216 may be lower than the output impedance of the charge pump 102. In some embodiments, the RLC post-filter 214-216 may be replaced by a resistor-capacitor (RC) post-filter or a inductor-capacitor (LC) post-filter.

Figure 3:
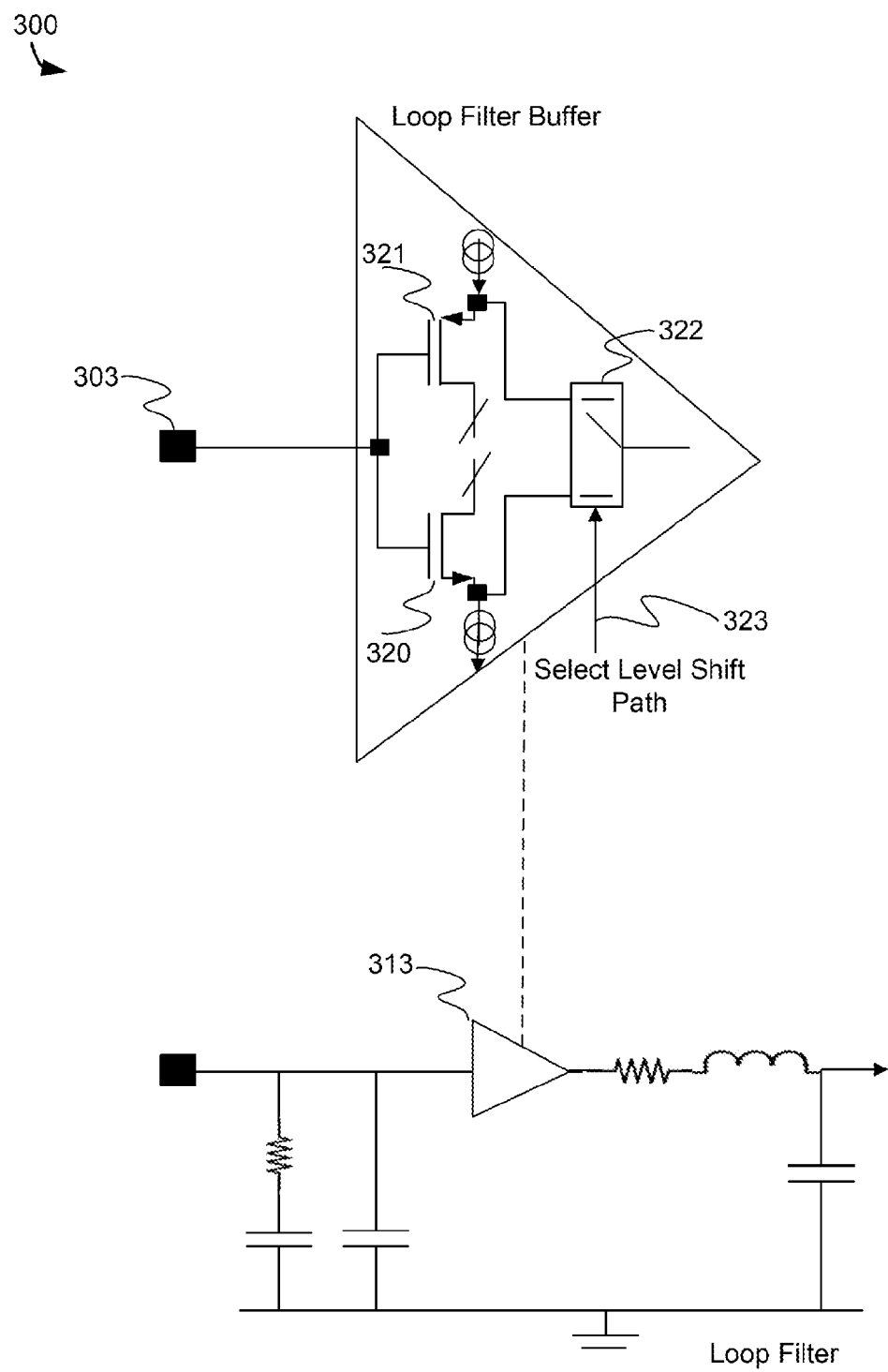
FIG. 3 illustrates an exemplary embodiment of a loop filter buffer in accordance with the present invention.

FIG. 3 illustrates exemplary embodiment 300 of a loop filter buffer in accordance with the present invention. In exemplary embodiment 300, the individual elements of the loop filter buffer 313 circuit are shown. The output signal 303 from the standard integrator and pole zero 210-212 may be the input to the loop filter buffer. Inside the buffer circuit, the signal 303 is connected to an N-type source follower 320 and a P-type source follower 321. The outputs from the N-type source follower 320 and the P-type source follower 321 are connected to a multiplexer 322 for selection. The multiplexer 322 may be an analog multiplexer and may have a selection input 323 (e.g., "Select Level Shift Path") for selecting between the output from the N-type source follower 320 and the output from the P-type source follower 321. The selection of the multiplexer 322 between the output from the N-type source follower 320 or the output from the P-type source follower 321 may, in some embodiments, be performed manually via a switch connected to the selection input 323. The selection may, in some embodiments, be performed dynamically using a fast-lock scheduler circuit (not shown). In some embodiments, the selection may be performed by surveying the VCO to determine any shift in voltage away from the intended voltage output from the VCO. If the shift in voltage requires adjustment (i.e., level shift) towards an increased positive voltage (e.g., when the tuning voltage is closer to VDD), then the output of the P-type source follower 321 is selected for passing through the multiplexer 322 by invoking the appropriate selection input 323. If the shift in voltage requires adjustment (i.e., level shift) towards a decreased negative voltage (e.g., when the tuning voltage is closer to ground (GND)), then the output of the N-type source follower 320 is selected for passing through the multiplexer 322 by invoking the appropriate selection input 323. A level shift using the P-type source follower 321 may equal, for example, approximately +0.5 volts (V). A level shift using the N-type source follower 320 may equal, for example, approximately −0.5 volts (V).

FIG. 4 illustrates an exemplary illustration 400 of the DC response characteristics of each charge-pump current source type versus the DC voltage present at the charge pump output in accordance with the conventional invention. In exemplary illustration 400, the relationship between the DC characteristics of the charge-pump 102 current source is illustrated in view of a tuning voltage (VDD) at the input of a VCO. The usable range 402 for a down source 403 and an up source 401 are also illustrated. As shown, the usable range 402 includes the areas where the output current has reached its steady state for the down source 403 and the up source 401. The usable range of the charge-pump may be widened where the steady state of the output current is reached faster, allowing the down source current and the up source current to reach their respective steady states more quickly.

Figure 5:
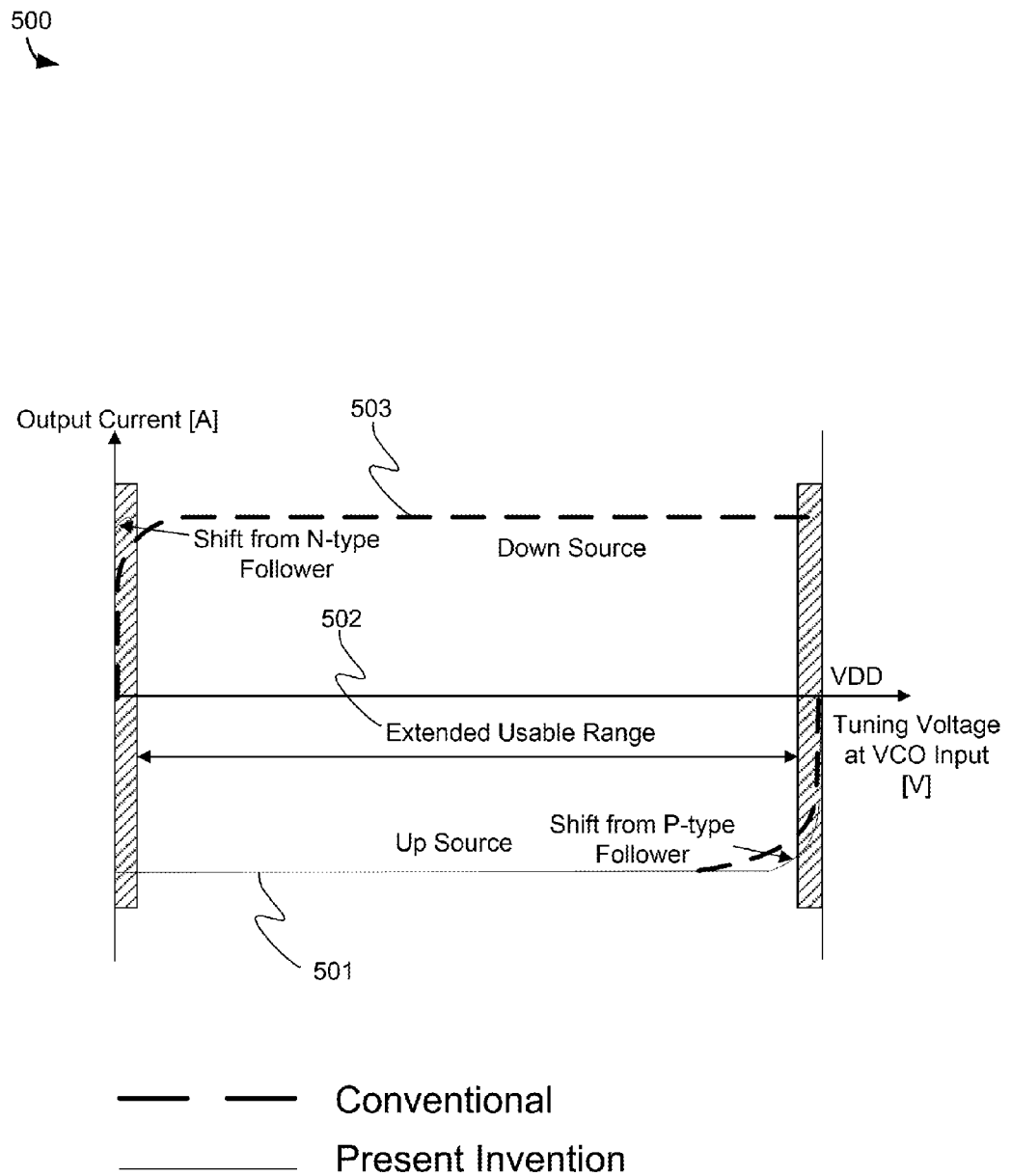
FIG. 5 illustrates an exemplary illustration of the DC response characteristics of each charge-pump current source type versus the tuning voltage at the VCO input, with correct selection of a loop filter source follower and an extended tuning range voltage at the VCO input in accordance with the present invention.

FIG. 5 illustrates an exemplary illustration 500 of the DC response characteristics of each charge-pump current source type versus the tuning voltage at the VCO input, with correct selection of a loop filter source follower and an extended tuning range voltage at the VCO input in accordance with the present invention. In exemplary illustration 500, the down source 503 reaches its steady state more quickly and, thus, the extended usable range 502 when an N-type source follower is selected. Similarly, the up source 501 reaches its steady state more quickly and, thus, the extended usable range 502 when a P-type source follower is selected. In exemplary illustration 500, the shift from the normal rise time to the steady state of the current (i.e., the shift from a dotted line to a solid line in FIG. 5) that is reached by using the N-type source follower or P-type source follower is shown.

Figure 6:
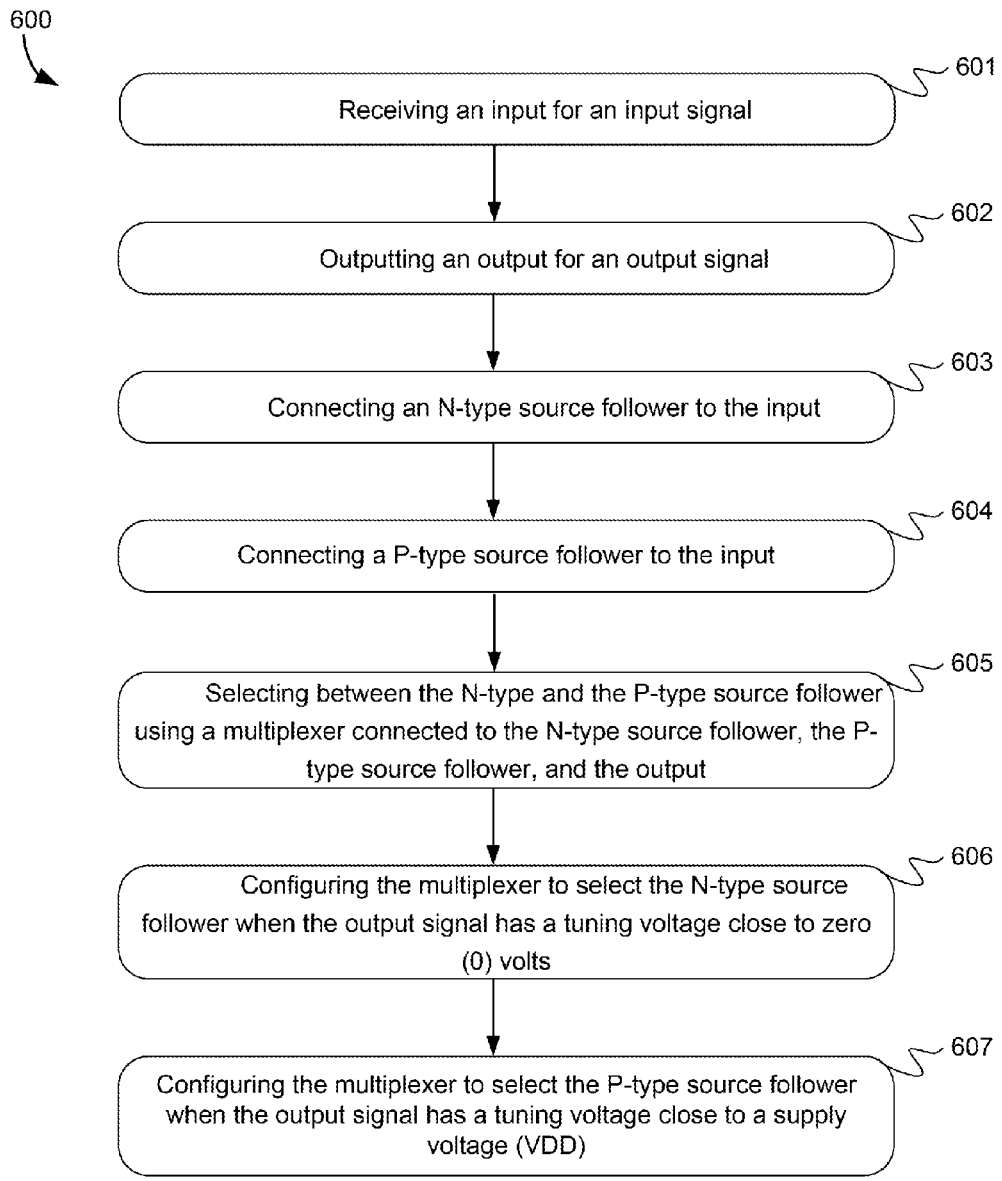
FIG. 6 illustrates exemplary PLL loop filter buffer method steps in accordance with the present invention.

FIG. 6 illustrates exemplary PLL loop filter buffer method steps 600 in accordance with the present invention. The PLL loop filter buffer method steps 600 are for receiving an input for an input signal 601, outputting an output for an output signal 602, connecting an N-type source follower to the input 603, connecting a P-type source follower to the input 604, selecting between the N-type and the P-type source follower using a multiplexer connected to the N-type source follower, the P-type source follower, and the output 605, configuring the multiplexer to select the N-type source follower when the output signal has a tuning voltage closer to zero (0) volts 606, and configuring the multiplexer to select the P-type source follower when the output signal has a tuning voltage closer to a supply voltage (VDD) 607.

Figure 7:
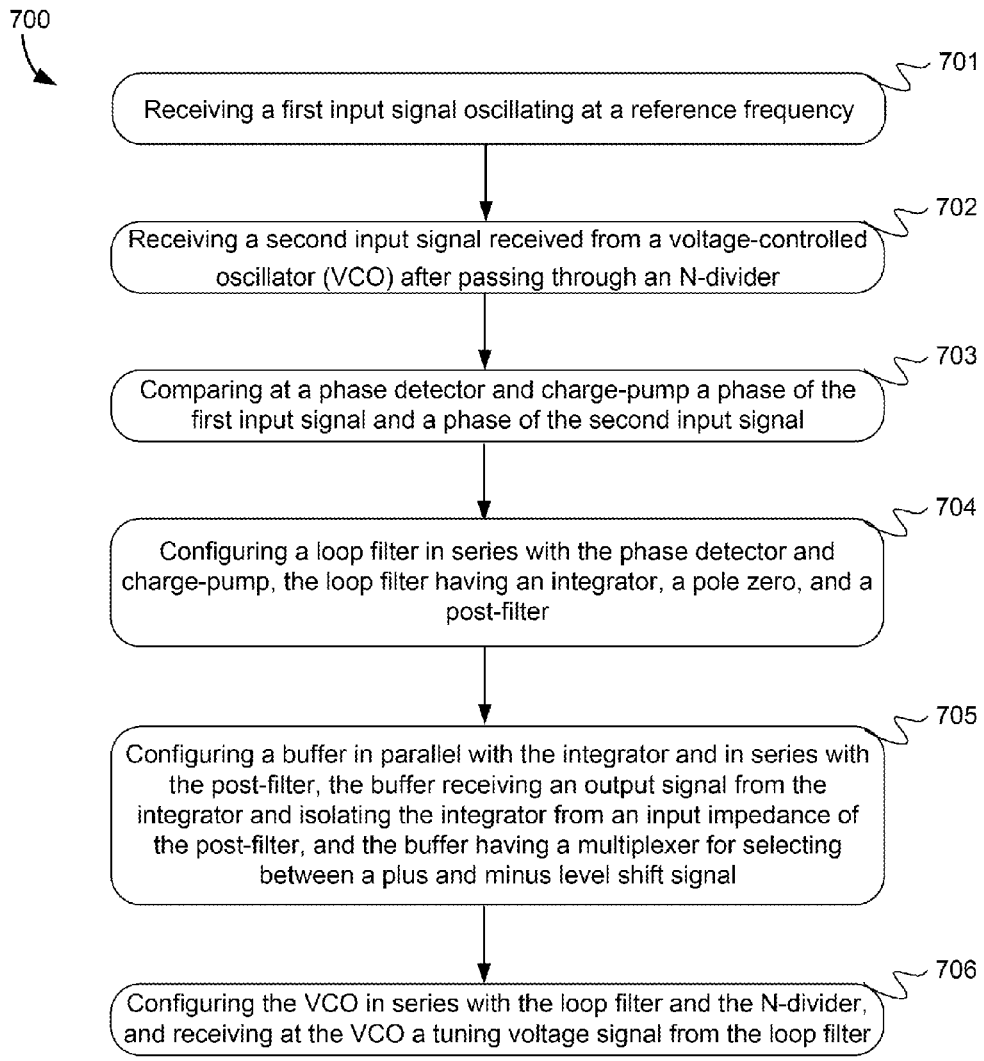
FIG. 7 illustrates exemplary PLL method steps in accordance with the present invention.

FIG. 7 illustrates exemplary PLL method steps 700 in accordance with the present invention. The PLL method steps 700 are for receiving a first input signal oscillating at a reference frequency 701, receiving a second input signal received from a voltage-controlled oscillator (VCO) after passing through an N-divider 702, comparing at a phase detector and charge-pump a phase of the first input signal and a phase of the second input signal 703, configuring a loop filter in series with the phase detector and charge-pump, the loop filter having an integrator, a pole zero, and a post-filter 704, configuring a buffer in parallel with the integrator and in series with the post-filter, the buffer receiving an output signal from the integrator and isolating the integrator from an input impedance of the post-filter, and the buffer having a multiplexer for selecting between a plus and minus level shift signal 705, and configuring the VCO in series with the loop filter and the N-divider, and receiving at the VCO a tuning voltage signal from the loop filter 706.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

I claim:
1. A phase-locked loop circuit, comprising:
 a voltage-controlled oscillator (VCO) for providing a VCO output signal;
 an N-divider having an input for receiving the VCO output signal and for providing an N-divided output signal;
 a first input for receiving a signal oscillating at a reference frequency;
 a second input for receiving the N-divided output signal;
 a phase detector and charge-pump, the phase detector for comparing a phase of the first input and a phase of the second input;
 a loop filter in series with the phase detector and charge-pump, the loop filter having an integrator, a pole zero, and a post-filter; and a buffer in parallel with the integrator and in series with the post-filter, the buffer for receiving an output signal from the integrator and for isolating the integrator from an input impedance of the post-filter, and the buffer having a multiplexer for selecting between a plus and minus level shift signal to expand a tuning range voltage at a VCO input, wherein the multiplexer comprises a selection input, wherein when the tuning range voltage is closer to VDD the plus level shift signal is selected via the selection input for passing through the multiplexer, wherein when the tuning range voltage is closer to ground the minus level shift signal is selected via the selection input for passing through the multiplexer, and wherein the VCO is in series with the loop filter and the N-divider, and the VCO is configured to receive a tuning voltage signal from the loop filter.

2. The phase-locked loop circuit of claim 1, wherein the plus level shift signal is generated by a P-type source follower.

3. The phase-locked loop circuit of claim 1, wherein the minus level shift signal is generated by an N-type source follower.

4. The phase-locked loop circuit of claim 1, wherein the loop filter receives a signal from the phase detector and charge-pump at the integrator.

5. The phase-locked loop circuit of claim 1, wherein the buffer has an input impedance approximately equal to an output impedance of the integrator and an output impedance approximately equal to the input impedance of the post-filter.

6. The phase-locked loop circuit of claim 1, wherein the N-divider receives an output oscillating signal from the VCO.

7. The phase-locked loop circuit of claim 1, wherein the N-divider outputs an N-divided frequency signal into the inverse voltage input of the phase detector and charge-pump.

8. The phase-locked loop circuit of claim 1, wherein a P-type source follower provides the plus level shift signal to level shift up the output from the charge-pump by a first voltage.

9. The phase-locked loop circuit of claim 8, wherein the plus level shift signal has a voltage equal to approximately +0.5 volts (V).

10. The phase-locked loop circuit of claim 1, wherein an N-type source follower provides the minus level shift signal to level shift down the output from the charge-pump by a second voltage.

11. The phase-locked loop circuit of claim 10, wherein the minus level shift signal has a voltage equal to approximately −0.5 volts (V).

12. A method implemented using a phase-locked loop circuit, the method comprising the steps of:
receiving a first input signal oscillating at a reference frequency;
receiving a second input signal from a voltage-controlled oscillator (VCO) after passing through an N-divider;
comparing at a phase detector and charge-pump a phase of the first input signal and a phase of the second input signal;
configuring a loop filter in series with the phase detector and charge-pump, the loop filter having an integrator, a pole zero, and a post-filter;
configuring a buffer in parallel with the integrator and in series with the post-filter, the buffer receiving an output signal from the integrator and isolating the integrator from an input impedance of the post-filter, and the buffer having a multiplexer with a selection input for selecting between a plus and minus level shift signal to expand a tuning range voltage at a VCO input; and
selecting, using the selection input when the tuning range voltage is closer to VDD, the plus level shift signal for passing through the multiplexer,
selecting, using the selection input when the tuning range voltage is closer to ground, the minus level shift signal for passing through the multiplexer, and
configuring the VCO in series with the loop filter and the N-divider, and receiving at the VCO a tuning voltage signal from the loop filter.

13. The method of claim 12, wherein the plus level shift signal is generated by a P-type source follower.

14. The method of claim 12, wherein the minus level shift signal is generated by an N-type source follower.

15. The method of claim 12, wherein the loop filter receives a signal from the phase detector and charge-pump at the integrator.

16. The method of claim 12, wherein the buffer has an input impedance approximately equal to an output impedance of the integrator and an output impedance approximately equal to the input impedance of the post-filter.

17. The method of claim 12, further comprising the step of receiving at the N-divider an output oscillating signal from the VCO.

18. The method of claim 17, further comprising the step of outputting by the N-divider an N-divided frequency signal into the inverse voltage input of the phase detector and charge-pump.

19. The method of claim 12, further comprising the step of providing by a P-type source follower the plus level shift signal to level shift up the output from the charge-pump by a first voltage.

20. The method of claim 19, wherein the plus level shift signal has a voltage equal to approximately +0.5 volts (V).

21. The method of claim 12, further comprising the step of providing by an N-type source follower the minus level shift signal to level shift down the output from the charge-pump by a second voltage.

22. The method of claim 21, wherein the minus level shift signal has a voltage equal to approximately −0.5 volts (V).

23. A loop filter buffer, comprising:
an input for receiving an input signal;
an output for outputting an output signal;
an N-type source follower connected to the input;
a P-type source follower connected to the input; and
a multiplexer connected to the N-type source follower, the P-type source follower, and the output, the multiplexer selecting between the N-type and the P-type source follower using a selection input to expand a tuning range voltage at a VCO input,
wherein the multiplexer is configured to select the N-type source follower, using the selection input, when the output signal has a tuning voltage close to zero (0) volts, and
wherein the multiplexer is configured to select the P-type source follower, using the selection input, when the output signal has a tuning voltage close to a supply voltage (VDD).

24. The loop filter buffer of claim 23, wherein the output is connected to an input of a post-filter circuit.

25. The loop filter buffer of claim 23, wherein the input is connected to an output of an integrator.

26. A method implemented using loop filter buffer, the method comprising the steps of:
receiving an input for an input signal;
outputting an output for an output signal;
connecting an N-type source follower to the input;

connecting a P-type source follower to the input;

selecting between the N-type and the P-type source follower, using a selection input, to expand a tuning range voltage at a VCO input using a multiplexer connected to the N-type source follower, the P-type source follower, and the output;

configuring the multiplexer to select the N-type source follower, using the selection input, when the output signal has a tuning voltage close to zero (0) volts; and configuring the multiplexer to select the P-type source follower, using the selection input, when the output signal has a tuning voltage close to a supply voltage (VDD).

27. The method of claim 26, further comprising the step of connecting the output to an input of a post-filter circuit.

28. The method of claim 26, further comprising the step of connecting the input to an output of an integrator.

* * * * *